United States Patent
Lin et al.

(10) Patent No.: US 12,266,651 B2
(45) Date of Patent: Apr. 1, 2025

(54) ELECTROSTATIC DISCHARGE PROTECTION STRUCTURE

(71) Applicant: Vanguard International Semiconductor Corporation, Hsinchu (TW)

(72) Inventors: Chang-Min Lin, Taichung (TW); Chih-Hsuan Lin, Hsinchu (TW); Yeh-Ning Jou, Hsinchu (TW); Hwa-Chyi Chiou, Hsinchu (TW); Jian-Hsing Lee, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 443 days.

(21) Appl. No.: 17/724,700

(22) Filed: Apr. 20, 2022

(65) Prior Publication Data
US 2023/0343780 A1    Oct. 26, 2023

(51) Int. Cl.
H01L 27/02    (2006.01)
(52) U.S. Cl.
CPC ...... *H01L 27/0296* (2013.01); *H01L 27/0266* (2013.01)

(58) Field of Classification Search
CPC .............. H01L 27/0296; H01L 27/0266
See application file for complete search history.

(56) References Cited

U.S. PATENT DOCUMENTS

| | | | |
|---|---|---|---|
| 2013/0075809 A1* | 3/2013 | Hsieh | H01L 29/66727 438/237 |
| 2016/0163691 A1* | 6/2016 | Edwards | H01L 23/5283 438/234 |
| 2018/0337231 A1* | 11/2018 | Tanaka | H01L 27/0266 |

* cited by examiner

*Primary Examiner* — Kyoung Lee
*Assistant Examiner* — Christina A Sylvia
(74) *Attorney, Agent, or Firm* — Birch, Stewart, Kolasch & Birch, LLP

(57) ABSTRACT

An electrostatic discharge (ESD) protection structure including a P-type substrate, a P-type structure, an N-type buried layer, an element active region, a P-type guard ring, and an N-type structure is provided. The P-type structure is formed in the P-type substrate and serves as an electrical contact of the P-type substrate. The N-type buried layer is formed in the P-type substrate. The element active region is formed on the N-type buried layer. The P-type guard ring is formed on the N-type buried layer and surrounds the element active region. The N-type structure is formed on the N-type buried layer and disposed between the P-type guard ring and the P-type structure.

13 Claims, 4 Drawing Sheets

ELECTROSTATIC DISCHARGE PROTECTION STRUCTURE

BACKGROUND OF THE INVENTION

Field of the Invention

The invention relates to an electrostatic discharge (ESD) protection structure, and more particularly to an ESD protection structure which has a P-type guard ring.

Description of the Related Art

As the semiconductor manufacturing process develops, electrostatic discharge (ESD) protection has become one of the most critical reliability issues for integrated circuits (IC). In particular, as semiconductor processing advances into the deep sub-micron stage, scaled-down devices and thinner gate oxides are more vulnerable to ESD stress. Generally, the input/output pads on IC chips must at least sustain 2 kVolt ESD stress of high Human Body Mode (HBM) or 200V of Machine Mode. Thus, the input/output pads on IC chips usually include ESD protect devices or circuits protecting the core circuit from ESD damage.

BRIEF SUMMARY OF THE INVENTION

In accordance with an embodiment of the disclosure, an electrostatic discharge (ESD) protection structure comprises a P-type substrate, a P-type structure, an N-type buried layer, an element active region, a P-type guard ring, and an N-type structure. The P-type structure is formed in the P-type substrate and serves as an electrical contact of the P-type substrate. The N-type buried layer is formed in the P-type substrate. The element active region is formed on the N-type buried layer. The P-type guard ring is formed on the N-type buried layer and surrounds the element active region. The N-type structure is formed on the N-type buried layer and disposed between the P-type guard ring and the P-type structure.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
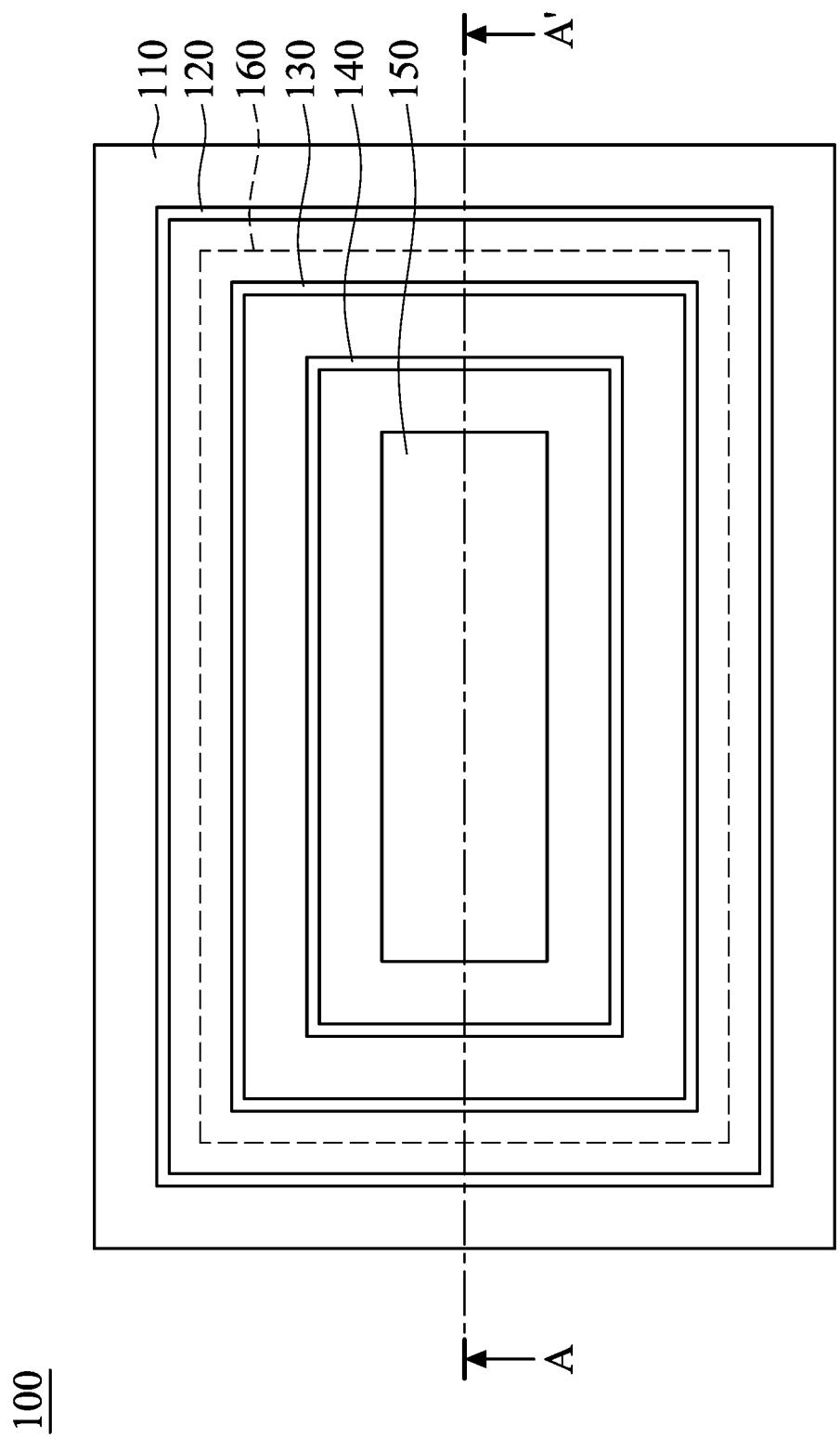
FIG. 1 is a plan view of an electrostatic discharge (ESD) protection structure in accordance with some embodiments of the disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a plan view of an electrostatic discharge (ESD) protection structure in accordance with some embodiments of the disclosure. As shown in FIG. 1, the electrostatic discharge (ESD) protection structure 100 comprises a P-type substrate 110, a P-type structure 120, an N-type structure 130, a P-type guard ring 140 and an element active region 150. In some embodiment, the ESD protection structure 100 is applied in a high-voltage side, such as an input-output pin.

The P-type structure 120 is formed in the P-type substrate 110 and serves as an electrical contact of the P-type substrate 110. The shape of the P-type structure 120 is not limited in the present disclosure. In one embodiment, the P-type structure 120 is a ring-shaped structure. In this case, the P-type structure 120 surrounds the N-type structure 130.

The N-type structure 130 is disposed between the P-type structure 120 and the P-type guard ring 140. The shape of N-type structure 130 is not limited in the present disclosure. In one embodiment, the N-type structure 130 is a ring-shaped structure. In such cases, the N-type structure 130 surrounds the P-type guard ring 140. In some embodiments, the N-type structure 130 is covered by a field oxide layer (not shown). In this case, the field oxide layer is spaced apart the P-type structure 120 from the P-type guard ring 140 and exposed from the P-type structure 120 and the P-type guard ring 140.

The P-type guard ring 140 surrounds the element active region 150. In some embodiments, the ESD protection structure 100 further comprises an N-type buried layer 160. The N-type buried layer 160 is formed in the P-type substrate 110. In this case, the N-type structure 130, the P-type guard ring 140 and the element active region 150 are formed on the N-type buried layer 160. In one embodiment, the N-type structure 130, the P-type guard ring 140 and the element active region 150 directly contact the N-type buried layer 160. In other embodiments, the P-type structure 120 does not overlap the N-type buried layer 160. For example, a projection area of the P-type structure 120 on the P-type substrate 110 does not overlap a projection area of the N-type buried layer 160 on the P-type substrate 110.

Figure 2:
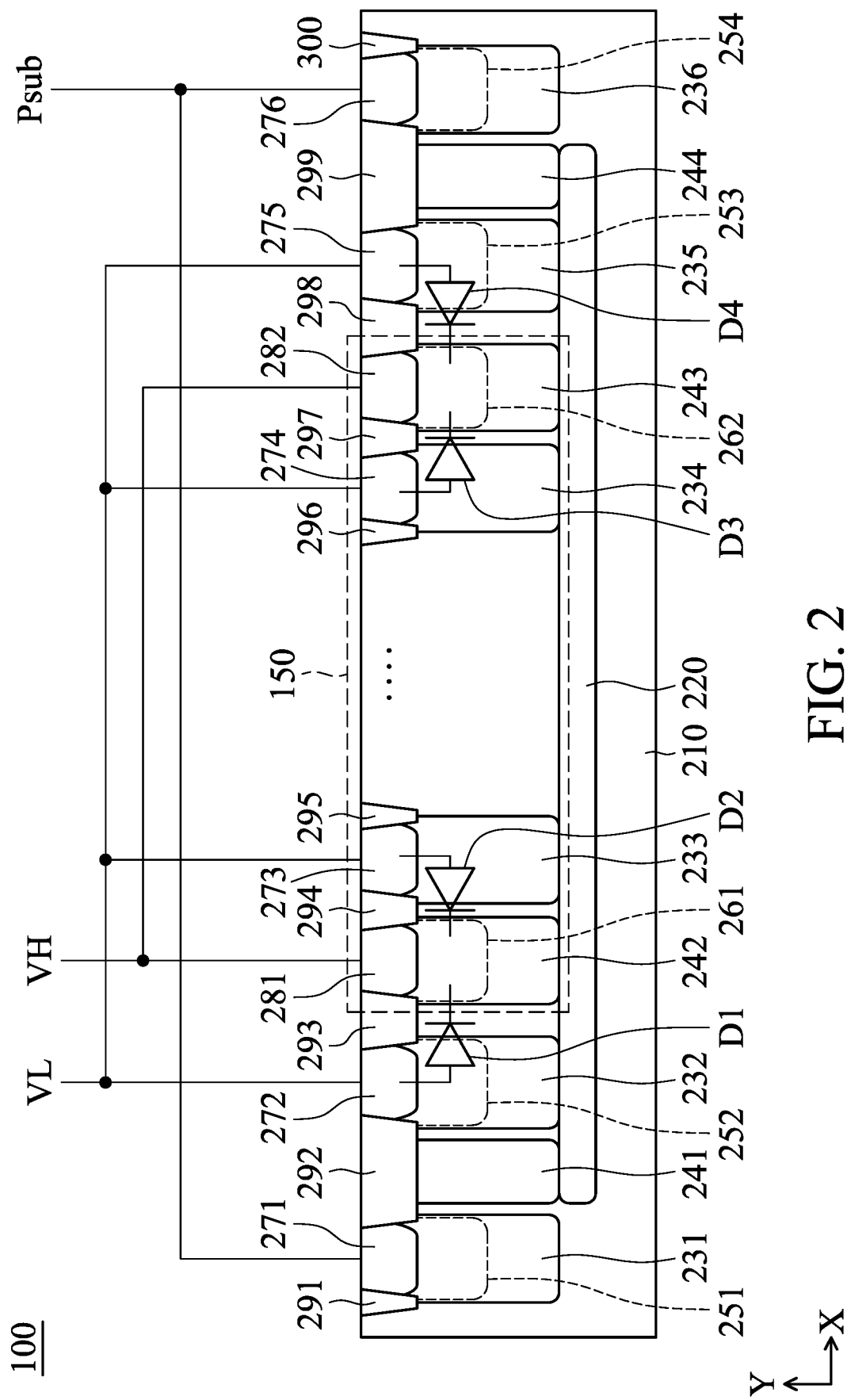
FIG. 2 is a cross-sectional view taken alone a line A-A' of the ESD protection structure of FIG. 1.

FIG. 2 is a cross-sectional view taken alone a line A-A' of the ESD protection structure of FIG. 1. The ESD protection structure 100 comprises a P-type substrate 210 (which is the same as the P-type substrate 110 of FIG. 1) and an N-type buried layer 220 (which is the same as the N-type buried layer 160 of FIG. 1). The N-type buried layer 220 is formed in the P-type substrate 210. In some embodiments, the ESD protection structure 100 further comprises P-type wells 231, 232, 235, and 236, N-type wells 241 and 244, and an element active region 150.

The P-type wells 231 and 236 are formed in the P-type substrate 210 and isolated from the N-type buried layer 220. In this embodiment, a projection area of P-type well 231 on the P-type substrate 210 does not overlap a projection area of N-type buried layer 220 on the P-type substrate 210. A projection area of P-type well 236 on the P-type substrate 210 does not overlap a projection area of N-type buried layer 220 on the P-type substrate 210. In one embodiment, each of the P-type wells 231 and 236 is a high voltage P-type well (HVPW). In another embodiment, the P-type wells 231 and 236 take the form of a ring. In this case, the form of the ring constituted by the P-type wells 231 and 236 surrounds the N-type wells 241 and 244.

In this embodiment, the P-type well 231 comprises a P-type doped region 271. The P-type doped region 271 is formed in the P-type well 231 and serves as an electrical contact of the P-type substrate 210. In some embodiments, the P-type well 231 further comprises a P-type well 251. The P-type well 251 is formed in the P-type well 231. The P-type doped region 271 is formed in the P-type well 251. In such case, the doped concentration of the P-type doped region 271 is higher than the doped concentration of the P-type well 251, and the doped concentration of the P-type well 251 is higher than the doped concentration of the P-type well 231.

Furthermore, the P-type well 236 comprises a P-type doped region 276. The P-type doped region 276 is formed in the P-type well 236 and serves as an electrical contact of the P-type substrate 210. In some embodiments, the P-type well 236 further comprises a P-type well 254. The P-type well 254 is formed in the P-type well 236. The P-type doped region 276 is formed in the P-type well 254. In this case, the doped concentration of the P-type doped region 276 is higher than the doped concentration of the P-type well 254, and the doped concentration of the P-type well 254 is higher than the doped concentration of the P-type well 236. In some embodiments, the P-type doped regions 271 and 276 take the form of a ring which is provided as the P-type structure 120 of FIG. 1. In addition, the P-type wells 251 and 254 also take the form of a ring.

The N-type wells 241 and 244 are formed on the N-type buried layer 220 and overlap the N-type buried layer 220. In other words, a projection area of the N-type well 241 on the P-type substrate 210 overlaps a projection area of N-type buried layer 220 on the P-type substrate 210, and a projection area of the N-type well 244 on the P-type substrate 210 overlaps the projection area of N-type buried layer 220 on the P-type substrate 210. In one embodiment, the N-type wells 241 and 244 contact the N-type buried layer 220. In other embodiments, each of the N-type wells 241 and 244 is a high-voltage N-type well (HVNW). In some embodiments, the N-type wells 241 and 244 form a ring-shaped structure which surrounds the P-type wells 232 and 235 to prevent the P-type wells 232 and 235 from contacting the P-type substrate 210. In this embodiment, the ring-shaped structure constituted by the N-type wells 241 and 244 serves as the N-type structure 130 of FIG. 1.

The P-type wells 232 and 235 are formed on the N-type buried layer 220 and contact the N-type buried layer 220. In this embodiment, a projection area of the P-type well 232 on the P-type substrate 210 overlaps a projection area of the N-type buried layer 220 on the P-type substrate 210, and a projection area of the P-type well 235 on the P-type substrate 210 overlaps a projection area of the N-type buried layer 220 on the P-type substrate 210. In one embodiment, the P-type wells 232 and 235 are HVPWs. In some embodiments, the P-type wells 232 and 235 constitute a ring-shaped structure to surround the element active region 150.

In this embodiment, the P-type well 232 comprises a P-type doped region 272. The P-type doped region 272 is formed in the P-type well 232. In some embodiments, the P-type well 232 further comprises a P-type well 252. The P-type well 252 is formed in the P-type well 232. The P-type doped region 272 is formed in the P-type well 252. In this case, the doped concentration of the P-type doped region 272 is higher than the doped concentration of the P-type well 252, and the doped concentration of the P-type well 252 is higher than the doped concentration of the P-type well 232.

Additionally, the P-type well 235 comprises a P-type doped region 275. The P-type doped region 275 is formed in the P-type well 235. In some embodiments, the P-type well 235 further comprises a P-type well 253. The P-type well 253 is formed in the P-type well 235. The P-type doped region 275 is formed in the P-type well 253. In this case, the doped concentration of the P-type doped region 275 is higher than the doped concentration of the P-type well 253, and the doped concentration of the P-type well 253 is higher than the doped concentration of the P-type well 235. In other embodiments, the P-type doped regions 272 and 275 constitute a ring-shaped structure. In this case, the ring-shaped structure comprising the P-type doped regions 272 and 275 is provided as the P-type guard ring 140 of FIG. 1.

In some embodiments, the ESD protection structure 100 further comprises field oxide layers 292 and 299. The field oxide layer 292 is formed in the surface of the P-type substrate 210. In this case, the field oxide layer 292 isolates the P-type doped region 271 from the P-type doped region 272. The field oxide layer 292 is exposed between the P-type doped regions 271 and 272. In this embodiment, the field oxide layer 292 completely covers the N-type well 241. In other embodiments, the field oxide layer 292 partially covers the P-type wells 231, 251, 232, and 252. Additionally, the field oxide layer 299 is formed in the surface of the P-type substrate 210. In this case, the field oxide layer 299 is spaced apart the P-type doped region 275 from the P-type doped region 276 and exposed from the P-type doped regions 275 and 276. In this embodiment, the field oxide layer 299 completely covers the N-type well 244. In other embodiments, the field oxide layer 299 partially covers the P-type wells 235, 253, 236, and 254. In some embodiments, the field oxide layers 292 and 299 take the form of a ring.

In other embodiments, the ESD protection structure 100 further comprises field oxide layers 291, 293, 298, and 300. The field oxide layer 291 is disposed between the P-type substrate 210 and the P-type doped region 271. In some embodiments, the field oxide layer 291 partially covers the P-type wells 231 and 251. The field oxide layer 293 is disposed between the P-type doped region 272 and the element active region 150. In some embodiments, the field oxide layer 293 partially covers the P-type wells 232 and 252, and the element active region 150.

The field oxide layer 298 is disposed between the element active region 150 and the P-type doped region 275. In some embodiments, the field oxide layer 298 partially covers the element active region 150, the P-type well 235, and the P-type well 253. The field oxide layer 300 disposed between the P-type doped region 276 and the P-type substrate 210. In some embodiments, the field oxide layer 300 partially covers the P-type wells 236 and 254. In other embodiments, the widths of the field oxide layers 292 and 299 in the direction X are larger than the widths of the field oxide layers 291, 293, 298, and 300 in the direction X. In this case, the depths of the field oxide layers 291~293, 298, and 300 in the direction Y are similar to each other.

The element active region 150 is formed on the N-type buried layer 220 and disposed between the field oxide layers 293 and 298. The structure of element active region 150 is not limited in the present disclosure. In one embodiment, the element active region 150 at least comprises N-type wells 242 and 243, and P-type wells 233 and 234.

The N-type wells 242 and 243 are formed on the N-type buried layer 220 and contact the N-type buried layer 220. In one embodiment, each of the N-type wells 242 and 243 is a HVNW. In another embodiment, the N-type wells 242 and 243 take the form of a ring. The N-type wells 242 and 243 with the N-type buried layer 220 surround the core elements in the element active region 150.

In this embodiment, the N-type well 242 comprises an N-type doped region 281. The N-type doped region 281 is formed in the N-type well 242. In some embodiments, the N-type well 242 further comprises an N-type well 261. The N-type well 261 is formed in the N-type well 242. The N-type doped region 281 is formed in the N-type well 261. In this case, the doped concentration of the N-type doped region 281 is higher than the doped concentration of the N-type well 261, and the doped concentration of the N-type well 261 is higher than the doped concentration of the N-type well 242.

Additionally, the N-type well 243 comprises an N-type doped region 282. The N-type doped region 282 is formed in the N-type well 243. In some embodiments, the N-type well 243 further comprises an N-type well 262. The N-type well 262 is formed in the N-type well 243. The N-type doped region 282 is formed in the N-type well 262. In this case, the doped concentration of the N-type doped region 282 is higher than the doped concentration of the N-type well 262, and the doped concentration of the N-type well 262 is higher than the doped concentration of the N-type well 243. In some embodiment, the N-type doped regions 281 and 282 constitute a ring-shaped structure, and the N-type wells 261 and 262 also constitute a ring-shaped structure.

The P-type wells 233 and 234 are formed on the N-type buried layer 220 and contact the N-type buried layer 220. In one embodiment, each of the P-type wells 233 and 234 is a HVPW. In another embodiment, the P-type wells 233 and 234 takes the form of a ring. In this embodiment, the P-type well 233 comprises a P-type doped region 273. The P-type doped region 273 is formed in the P-type well 233. In this case, the doped concentration of the P-type doped region 273 is higher than the doped concentration of the P-type well 233. Furthermore, the P-type well 234 comprises a P-type doped region 274. The P-type doped region 274 is formed in the P-type well 234. In such cases, the doped concentration of the P-type doped region 274 is higher than the doped concentration of the P-type well 234. In some embodiments, the P-type doped regions 273 and 274 take the form of a ring.

In other embodiments, the ESD protection structure 100 further comprises power lines VL and VH. The power line VL is electrically connected to the P-type doped regions 272-275 and serves as a power terminal. The power line VH is electrically connected to the N-type doped regions 281 and 282 and serves as a second power terminal. In an normal mode (no ESD event), the power line VH receives a first operation voltage, and the power line VL receives a second operation voltage. The first operation voltage is higher than the second operation voltage. In other embodiments, the ESD protection structure 100 further comprises a substrate terminal Psub. The substrate terminal Psub is electrically connected to the P-type doped regions 271 and 276. The power line VL and VH, and the substrate terminal Psub are isolated from each other.

When an ESD event occurs on the power line VL and the power line VH receives a ground voltage, the ESD protection structure 100 enters a protection mode. In the protection mode, the voltage of the substrate terminal Psub is a floating voltage. At this time, since the voltages of the P-type doped regions 272 and 273 are higher than the voltage of the N-type doped region 281, the body diode D1 between the P-type well 232 and the N-type well 242 and the body diode D2 between the P-type well 233 and the N-type well 242 are turned on. Therefore, a first ESD current flows from the power line VL, through the P-type doped region 272, the P-type well 232, the N-type well 242, and the N-type doped region 281, and to the power line VH. A second ESD current flows from the power line VL, through the P-type doped region 273, the P-type well 233, the N-type well 242 and the N-type doped region 281, and to the power line VH.

Similarly, in the protection mode, since the voltages of the P-type doped regions 274 and 275 are higher than the voltage of the N-type doped region 282, the body diode D3 between the P-type well 234 and the N-type well 243 and the body diode D4 between the P-type well 235 and the N-type well 243 are turned on. Therefore, a third ESD current flows from the power line VL, through the P-type doped region 274, the P-type well 234, the N-type well 243, and the N-type doped region 282, and to the power line VH. A fourth ESD current flows from the power line VL, through the P-type doped region 275, the P-type well 235, the N-type well 243 and the N-type doped region 282, and to the power line VH. Since the body diodes D1~D4 discharge the ESD current together so that the ESD endurance of the ESD protection structure 100 is increased.

In some embodiments, the element active region 150 further comprises field oxide layers 294~297. The field oxide layer 294 is configured to isolate the N-type doped region 281 from the P-type doped region 273. The field oxide layer 294 is exposed between the N-type doped region 281 and the P-type doped region 273. In one embodiment, the field oxide layer 294 partially covers the N-type well 242, the N-type well 261, and a the P-type well 233. The P-type doped region 273 is disposed between the field oxide layers 294 and 295. In one embodiment, the field oxide layer 295 overlaps a portion of the P-type well 233. The P-type doped region 274 is disposed between the field oxide layers 296 and 297. In one embodiment, the field oxide layer 296 overlaps a portion of the P-type well 234. The field oxide layer 297 is configured to space apart the N-type doped region 282 from the P-type doped region 274 and expose from the N-type doped region 282 and the P-type doped region 274. In one embodiment, the field oxide layer 297 partially covers the N-type well 243, the N-type well 262, and the P-type well 234.

Figure 3:
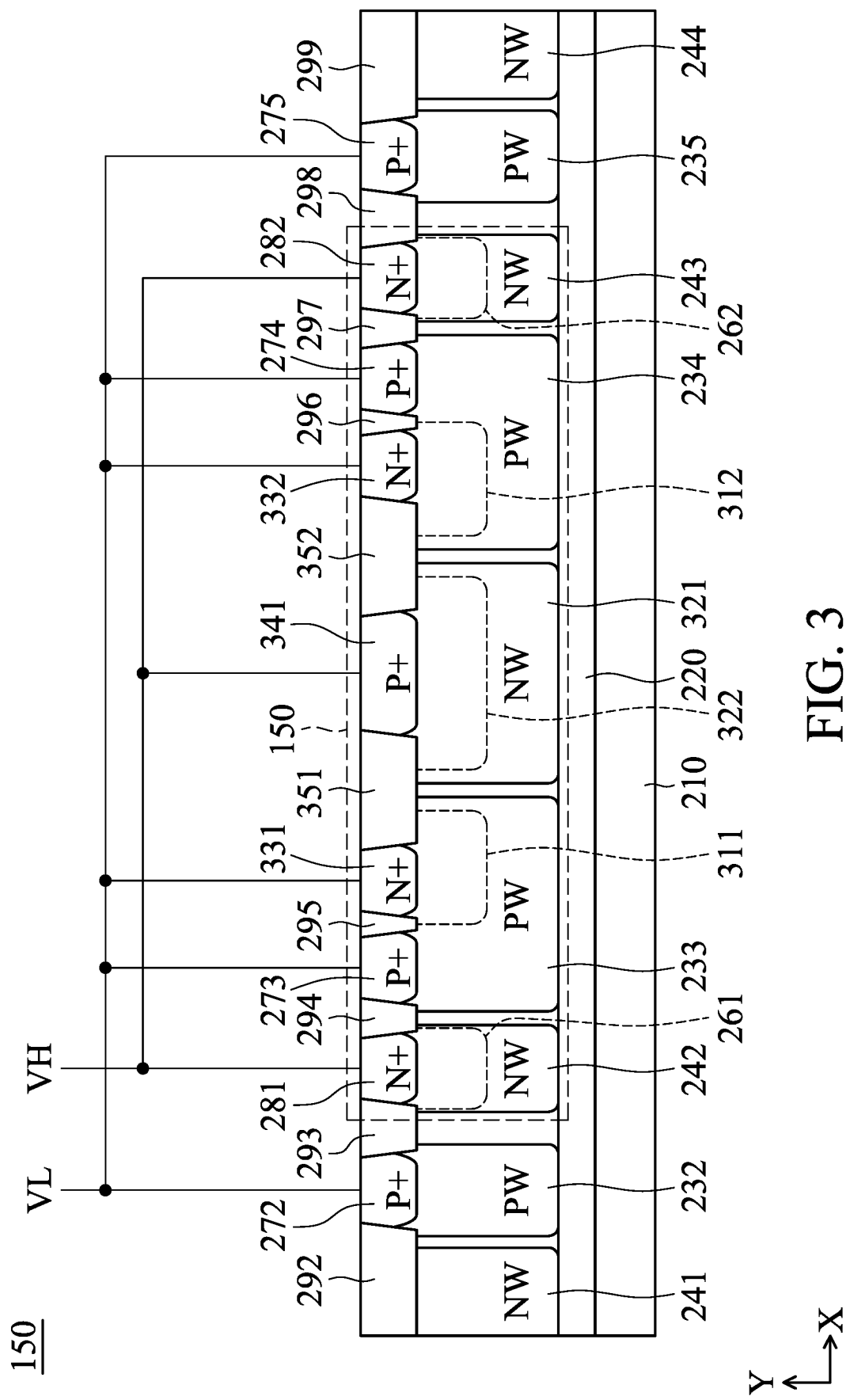
FIG. 3 is a schematic diagram of an exemplary embodiment of an element active region according to various aspects of the present disclosure.

FIG. 3 is a schematic diagram of an exemplary embodiment of an element active region according to various aspects of the present disclosure. The element active region 150 comprises N-type wells 242, 321 and 243, and P-type wells 233 and 234. The N-type wells 242 and 243 are formed on the N-type buried layer 220 and contact the N-type buried layer 220. Since the features of the N-type wells 242 and 243 are described above, the descriptions of the N-type wells 242 and 243 are omitted.

The P-type wells 233 and 234 are formed on the N-type buried layer 220 and are in contact with the N-type buried layer 220. In this embodiment, the P-type well 233 comprises a P-type doped region 273, an N-type doped region 331, and a P-type well 311. Since the feature of the P-type doped region 273 is described, the description of the P-type doped region 273 is omitted. The P-type well 311 is formed in the P-type well 233. The doped concentration of the P-type well 311 is higher than the doped concentration of the P-type well 233. The N-type doped region 331 is formed in the P-type well 311. In this embodiment, the doped concentration of the N-type doped region 331 is similar to the doped concentration of the N-type doped region 281.

Furthermore, the P-type well 234 comprises a P-type doped region 274, an N-type doped region 332, and a P-type well 312. Since the feature of the P-type doped region 274 is described above, the description of the P-type doped region 274 is omitted. The P-type well 312 is formed in the P-type well 234. The doped concentration of the P-type well 312 is higher than the doped concentration of the P-type well 234. The N-type doped region 332 is formed in the P-type well 312. In this embodiment, the doped concentration of the N-type doped region 332 is similar to the doped concentration of the N-type doped region 331.

The N-type well 321 is formed on the N-type buried layer 220 and contact the N-type buried layer 220. In one embodiment, the N-type well 321 is a deep HVNW. In This embodiment, the N-type well 321 comprises an N-type well 322 and a P-type doped region 341. The N-type well 322 is formed in the N-type well 321. The doped concentration of the N-type well 322 is higher than the doped concentration of the N-type well 321. The P-type doped region 341 is formed in the N-type well 322. The doped concentration of the P-type doped region 341 is similar to the doped concentration of the P-type doped region 273.

In other embodiments, the element active region 150 further comprises field-oxide layers 293~295, 351, 352, and 296~298. Since the features of the field-oxide layers 293, 294, 297, and 298 are described above, the descriptions of the field-oxide layers 293, 294, 297, and 298 are omitted. The field-oxide layer 295 is disposed between the P-type doped region 273 and the N-type doped region 331. In some embodiments, the field-oxide layer 295 partially covers the P-type wells 233 and 311.

The field-oxide layer 351 is disposed between the N-type doped region 331 and the P-type doped region 341. In this embodiment, the field-oxide layer 351 overlaps a portion of the P-type well 233, a portion of the P-type well 311, a portion of the N-type well 321, and a portion of the N-type well 322. The field-oxide layer 352 is disposed between the P-type doped region 341 and the N-type doped region 332. In this case, the field-oxide layer 352 overlaps a portion of the N-type well 321, a portion of the N-type well 322, a portion of the P-type well 234, and a portion of the P-type well 312. The field-oxide layer 296 is disposed between the N-type doped region 332 and the P-type doped region 274. In one embodiment, the field-oxide layer 296 overlaps a portion of the P-type well 234 and a portion of the P-type well 312.

In this embodiment, the element active region 150 comprises a silicon controlled rectifier (SCR). In this case, the element active region 150 is electrically connected to the power lines VH and VL. When an ESD event occurs on one of the power lines VH and VL and the other of the power lines VH and VL is coupled to ground, the SCR discharges an ESD current to ground. For example, the N-type doped region 281, P-type doped region 341, and the N-type doped region 282 are electrically connected to the power line VH. Additionally, the P-type doped region 273, the N-type doped regions 331 and 332, and the P-type doped region 274 are electrically connected to the power line VL. When an ESD event occurs on the power line VH and the power line VL is coupled to ground, a first ESD current enters the P-type doped region 341, through the N-type wells 322 and 321, the P-type well 233 and 311, the N-type doped region 331, and the power line VL, and to ground. Furthermore, a second ESD current enters the P-type doped region 341, through the N-type wells 322 and 321, the P-type well 234 and 312, the N-type doped region 332, and the power line VL, and to ground.

Since the P-type guard ring constituted by the P-type doped regions 272 and 275 surrounds the element active region 150, the body diodes are added, such as the diodes D1 and D4 in FIG. 2. When the power line VL receives a positive ESD voltage and the power line VH receives a ground voltage, the diodes D1~D4 discharge the ESD current together. Therefore, the endurance of the ESD protection structure 100 is increased when the ESD protection structure 100 operates in a machine model (MM).

Figure 4:
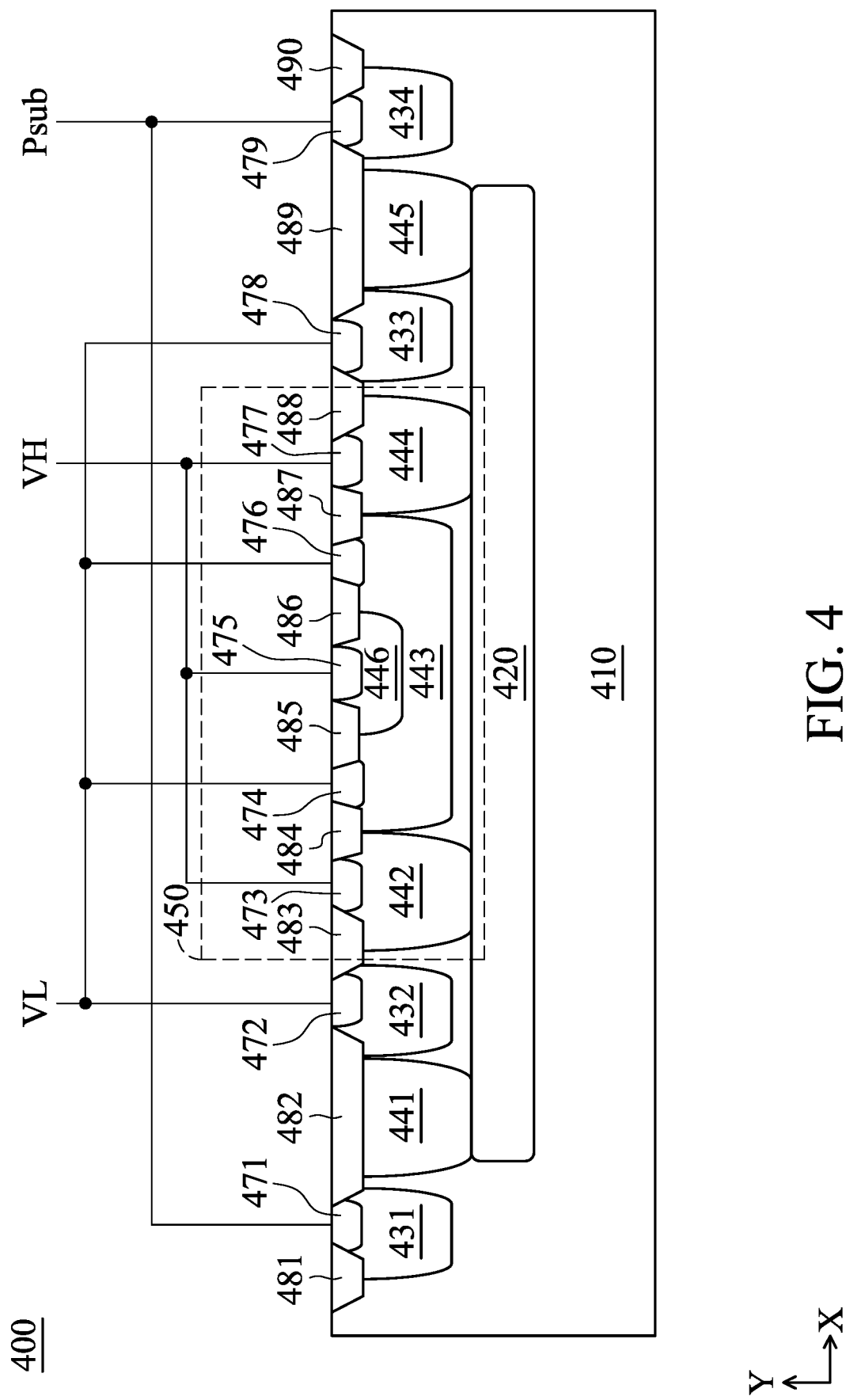
FIG. 4 is another cross-sectional view taken alone the line A-A' of the ESD protection structure of FIG. 1.

FIG. 4 is another cross-sectional view taken alone the line A-A' of the ESD protection structure of FIG. 1. The ESD protection structure 400 comprises a P-type substrate 410 and an N-type buried layer 420. The N-type buried layer 420 is formed in the P-type substrate 410. Since the features of the P-type substrate 410 and the N-type buried layer 420 are similar to the features of the P-type substrate 210 and the N-type buried layer 220 of FIG. 2, the descriptions of the P-type substrate 410 and the N-type buried layer 420 are omitted.

In some embodiments, the ESD protection structure 400 further comprises P-type wells 431~434, N-type wells 441 and 445, and an element active region 450. The P-type wells 431 and 434 are formed in the P-type substrate 410 and are isolated from the N-type buried layer 420. The N-type wells 441 and 445 are formed on the N-type buried layer 420 and overlap the N-type buried layer 420. Since the features of the P-type wells 431 and 434 and the N-type wells 441 and 445 are similar to the features of the P-type wells 231 and 236 and the N-type wells 241 and 244, the descriptions of the P-type wells 431 and 434 and the N-type wells 441 and 445 are omitted.

In some embodiments, the ESD protection structure 400 further comprises P-type doped regions 471, 472, 478, and 479. The P-type doped region 471 is formed in the P-type well 431. The P-type doped region 472 is formed in the P-type well 432. The P-type doped region 478 is formed in the P-type well 433. The P-type doped region 479 is formed in the P-type well 434. Since the features of the P-type doped regions 471, 472, 478, and 479 are similar to the features of the P-type doped regions 271, 272, 275, and 276, the descriptions of the features of the P-type doped regions 471, 472, 478, and 479 are omitted.

In this embodiment, the element active region 450 is formed on the N-type buried layer 420 and disposed between the P-type wells 432 and 433. The element active region 450 at least comprises N-type wells 442~444. In one embodiment, the N-type wells 442 and 444 contact the N-type buried layer 420 and surround the N-type well 443. In this case, the N-type wells 442 and 444 take the form of a ring. In some embodiments, each of the N-type wells 442 and 444 is a deep HVNW (DHVNW), and the N-type well 443 is a HVNW.

In other embodiments, the element active region 450 further comprises N-type doped regions 473 and 477. The N-type doped region 473 is formed in the N-type well 442. The N-type doped region 477 is formed in the N-type well 444. In this case, the doped concentrations of the N-type doped regions 473 and 477 are higher than the doped concentrations of the N-type wells 442 and 444.

In some embodiment, the element active region 450 further comprises P-type doped regions 474~476 and an N-type well 446. The P-type doped regions 474 and 476 are formed in the N-type well 443. The P-type doped regions 474 and 476 may constitute a ring-shaped structure which surrounds the P-type doped region 475. The P-type doped region 475 is formed in the N-type well 446. The N-type well 446 is disposed in the N-type well 443.

In other embodiments, the ESD protection structure 400 further comprises field-oxide layers 481~490. The P-type doped region 471 is disposed between the field-oxide layers 481 and 482. The P-type doped region 472 is disposed between the field-oxide layers 482 and 483. The P-type doped region 478 is disposed between the field-oxide layers 488 and 489. The P-type doped region 479 is disposed between the field-oxide layers 489 and 490. Since the features of the field-oxide layers 481~483 and 488~490 are similar to the features of the field-oxide layers 291~293 and 298~300, the descriptions of the features of the field-oxide layers 481~483 and 488~490 are omitted.

The N-type doped region 473 is disposed between the field-oxide layers 483 and 484. The P-type doped region 474 is disposed between the field-oxide layers 484 and 485. The P-type doped region 475 is disposed between the field-oxide layers 485 and 486. The P-type doped region 476 is disposed between the field-oxide layers 486 and 487. The N-type doped region 477 is disposed between the field-oxide layers 487 and 488. In some embodiments, the field-oxide layers 483 and 488 constitute a ring-shaped structure which is configured to surround the N-type doped regions 473 and 477. In one embodiment, the field-oxide layers 484 and 487 constitute a ring-shaped structure which is configured to surround the P-type doped regions 474 and 476. Additionally, the field-oxide layers 485 and 486 constitute a ring-shaped structure which is configured to surround the P-type doped region 475.

In other embodiments, the ESD protection structure 400 further comprises power lines VL and VH. The power line VL is electrically connected to the P-type doped regions 472, 474, 476, and 478. The power line VH is electrically connected to the N-type doped region 473, the P-type doped region 475, and the N-type doped region 477. In some embodiments, the ESD protection structure 400 further comprises a substrate terminal Psub. The substrate terminal Psub is electrically connected to the P-type doped regions 471 and 479.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electrostatic discharge (ESD) protection structure comprising:
    a P-type substrate;
    a first P-type structure formed in the P-type substrate and served as an electrical contact of the P-type substrate;
    an N-type buried layer formed in the P-type substrate;
    an element active region formed on the N-type buried layer;
    a P-type guard ring formed on the N-type buried layer and surrounding the element active region; and
    a first N-type structure formed on the N-type buried layer and disposed between the P-type guard ring and the first P-type structure,
    wherein the first P-type structure surrounds the first N-type structure.

2. The ESD protection structure as claimed in claim 1, wherein the first N-type structure surrounds the P-type guard ring.

3. The ESD protection structure as claimed in claim 1, wherein the element active region, the P-type guard ring, and the first N-type structure are in contact with the N-type buried layer.

4. The ESD protection structure as claimed in claim 1, wherein a projection area of the first P-type structure on the P-type substrate does not overlap a projection area of the N-type buried layer on the P-type substrate.

5. The ESD protection structure as claimed in claim 1, further comprising:
    a first P-type well formed on the N-type buried layer and in contact with the N-type buried layer;
    a first P-type doped region formed in the first P-type well;
    a second P-type well formed on the N-type buried layer and in contact with the N-type buried layer; and
    a second P-type doped region formed in the second P-type well,
    wherein the first P-type doped region and the second P-type doped region constitute the P-type guard ring.

6. The ESD protection structure as claimed in claim 5, further comprising:
    a first N-type well formed on the N-type buried layer and in contact with the N-type buried layer;
    a second N-type well formed on the N-type buried layer and in contact with the N-type buried layer,
    wherein the first N-type well and the second N-type well constitute the first N-type structure.

7. The ESD protection structure as claimed in claim 6, further comprising:
    a third P-type well formed in the P-type substrate;
    a third P-type doped region formed in the third P-type well;
    a fourth P-type well formed in the P-type substrate; and
    a fourth P-type doped region formed in the fourth P-type well,
    wherein the third P-type doped region and the fourth P-type doped region constitute the first P-type structure.

8. The ESD protection structure as claimed in claim 7, further comprising:
    a first field oxide layer disposed between the third P-type doped region and the first P-type doped region; and
    a second field oxide layer disposed between the second P-type doped region and the fourth P-type doped region.

9. The ESD protection structure as claimed in claim 8, wherein the first field oxide layer completely covers the first N-type well, and the second field oxide layer completely covers the second N-type well.

10. The ESD protection structure as claimed in claim 7, wherein a projection area of the third P-type well on the P-type substrate does not overlap a projection area of the N-type buried layer on the P-type substrate.

11. The ESD protection structure as claimed in claim 7, wherein the element active region comprises:
    a second N-type well formed on the N-type buried layer;
    a first N-type doped region formed in the second N-type well;
    a third N-type well formed on the N-type buried layer;

a second N-type doped region formed in the third N-type well;
a fifth P-type well formed on the N-type buried layer;
a fifth P-type doped region formed in the fifth P-type well;
a sixth P-type well formed in the fifth P-type well;
a third N-type doped region formed in the sixth P-type well;
a seventh P-type well formed on the N-type buried layer;
a sixth P-type doped region formed in the seventh P-type well;
an eighth P-type well formed in the seventh P-type well;
a fourth N-type doped region formed in the eighth P-type well;
a fourth N-type well formed on the N-type buried layer; and
a seventh P-type doped region formed in the fourth N-type well.

12. The ESD protection structure as claimed in claim 11, further comprising:
a first power line electrically connected to the first P-type doped region, the fifth P-type doped region, the third N-type doped region, the fourth N-type doped region, the sixth P-type doped region, and the second P-type doped region; and
a second power line electrically connected to the first N-type doped region, the seventh P-type doped region, and the second N-type doped region.

13. The ESD protection structure as claimed in claim 12, wherein the third P-type doped region and the fourth P-type doped region do not electrically connect to the first power line and the second power line.

* * * * *